(12) United States Patent
Kabadi et al.

(10) Patent No.: US 7,177,142 B2
(45) Date of Patent: Feb. 13, 2007

(54) HYBRID COMPRESSION SOCKET CONNECTOR FOR INTEGRATED CIRCUITS

(75) Inventors: Ashok N. Kabadi, Portland, OR (US); Frank R. DeWeese, McMinnville, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/955,676

(22) Filed: Sep. 29, 2004

(65) Prior Publication Data

US 2006/0067041 A1   Mar. 30, 2006

(51) Int. Cl.
*H05K 7/20* (2006.01)
*G01R 1/073* (2006.01)

(52) U.S. Cl. .................. 361/679; 257/779; 439/66; 324/755

(58) Field of Classification Search ........ 257/685–686, 257/778–779; 361/679–687, 724–727; 439/66, 439/79; 324/754, 755
See application file for complete search history.

(56) References Cited

U.S. PATENT DOCUMENTS

| | | | |
|---|---|---|---|
| 4,798,918 A | 1/1989 | Kabadi et al. | |
| 4,850,883 A | 7/1989 | Kabadi | |
| 4,917,613 A | 4/1990 | Kabadi | |
| 5,057,023 A | 10/1991 | Kabadi et al. | |
| 5,418,469 A | 5/1995 | Turner et al. | |
| 5,594,356 A | 1/1997 | Turner et al. | |
| 5,625,166 A | 4/1997 | Natarajan | |
| 5,955,888 A * | 9/1999 | Frederickson et al. | ...... 324/761 |
| 6,476,476 B1 * | 11/2002 | Glenn | ........................ 257/686 |
| 6,490,676 B1 | 12/2002 | Cota-Robles | |
| 6,585,527 B2 * | 7/2003 | Koopman et al. | ............ 439/71 |
| 6,614,659 B2 * | 9/2003 | Feigenbaum et al. | ....... 361/719 |
| 2003/0168738 A1 | 9/2003 | Kabadi | |

OTHER PUBLICATIONS

U.S. Appl. No. 10/982,103, filed Nov. 4, 2004, entitled "Low Profile and Tight Pad-Pitch Land-Grid-Array (LGA) Socket".

* cited by examiner

*Primary Examiner*—Hung Van Duong
(74) *Attorney, Agent, or Firm*—David P. McAbee

(57) ABSTRACT

The apparatus and method described herein are for coupling an integrated circuit to a circuit board, while eliminating the need for a backing plate, when a compression socket is utilized. A plurality of tension pins are coupled to an integrated circuit for engaging a plurality of corresponding barrels in a circuit board to compress a compression socket to make an electrical connection between the integrated circuit and the circuit board.

32 Claims, 5 Drawing Sheets

HYBRID COMPRESSION SOCKET CONNECTOR FOR INTEGRATED CIRCUITS

FIELD

This invention relates to the field of integrated circuits and, in particular, to coupling integrated circuit to circuit boards.

BACKGROUND

Advances in semi-conductor processing and logic design have permitted an increase in the amount of logic that may be present on integrated circuit devices. As a result, integrated circuits have increased the number of input, output, power, and ground signals that are used to power the integrated circuits, to communicate with external devices, and to receive data/instructions. Moreover, the physical size of a typical integrated circuit package has grown to accommodate the increase in the number of pins/pads.

Often, integrated circuits are packaged individually and later coupled to a circuit board to communicate with other devices. One method of coupling an integrated circuit to a circuit board, such as a motherboard or expansion card, includes directly soldering the integrated circuit device to the circuit board. Although, this creates an adequate electrical connection between the pads of the device and the circuit board, the direct soldering of the device creates potential upgrade and swapability limitations. For example, if a microprocessor is directly soldered to a motherboard and is later found to be defective, then the microprocessor needs to be de-soldered. The de-soldering, replacement, and re-soldering process is potentially expensive and tedious.

Therefore, it is common in the industry to use compression sockets to couple an integrated circuit to a circuit board. For example, current Intel Micro-processors, from Intel Corporation in Santa Clara, Calif., are typically, connected to a motherboard using a grid array compression socket. A compression socket usually includes some type of compression contact that, when compressed, makes an electrical connection between a pad of an integrated circuit and a pad on the motherboard.

FIG. 1 illustrates a prior art method of compressing compression socket 115 to make an electrical connection between integrated circuit 105 and motherboard 120. One example of integrated circuit 105 is a microprocessor in a package, such as a flip-chip pin grid array (FCPGA) package. Bottom clamping plate 125 in combination with top clamping plate 130 typically exerts a compression force to compress socket 115. Bottom clamping plate 125 is usually mounted on the underside or backside of motherboard 120 to avoid out of specification warping of motherboard 120. However, placement of bottom clamping plate 120 on the backside of motherboard 120 may (1) limit the ability to place other critical components on the backside of the motherboard, such as capacitors or other active or passive devices and (2) create undue stress on the motherboard resulting in cracking or warping.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as specific compressions sockets, tension pin styles, and system implementations in order to provide a thorough understanding of the present invention. It will be apparent, however, to one skilled in the art that these specific details need not be employed to practice the present invention. In other instances, well known components or methods, such well-known packaging, soldering, and force applying techniques, as well as specific heat spreader/sink devices, contact structures, etc., have not been described in detail in order to avoid unnecessarily obscuring the present invention.

The apparatus and method described herein are for coupling an integrated circuit to a circuit board, while eliminating the need for a backing plate, when a compression socket is utilized. It is readily apparent to one skilled in the art, that the method and apparatus disclosed herein may be implemented in any system where a device is coupled to a circuit board. For example, the apparatus and methods described herein may be used for coupling an embedded controller to a printed circuit board or a microprocessor to a motherboard.

Figure 1:
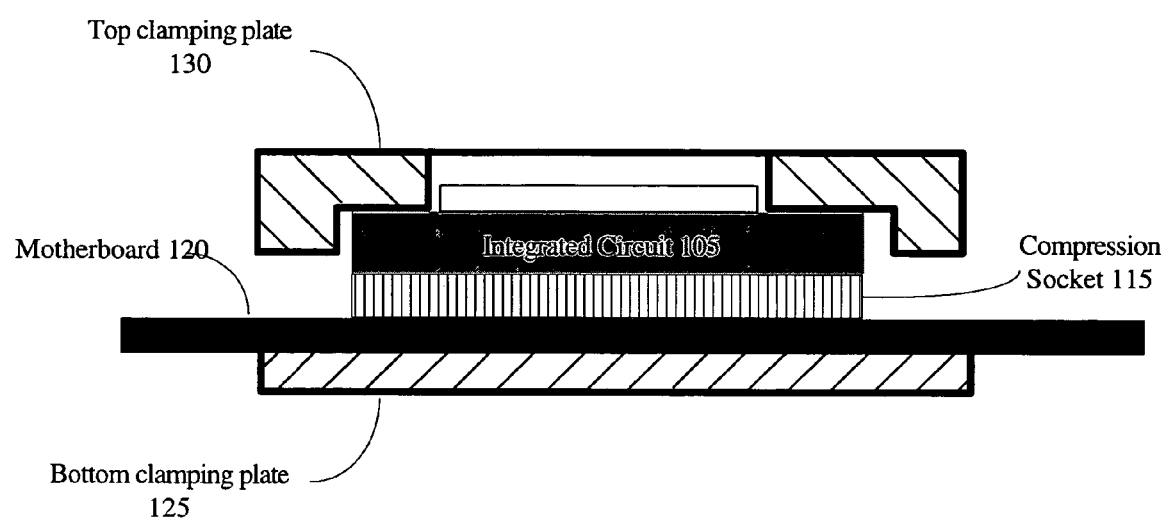
FIG. 1 illustrates a cross-sectional elevation view of a prior art bottom and top clamping system for compressing a compression socket.
Figure 2:
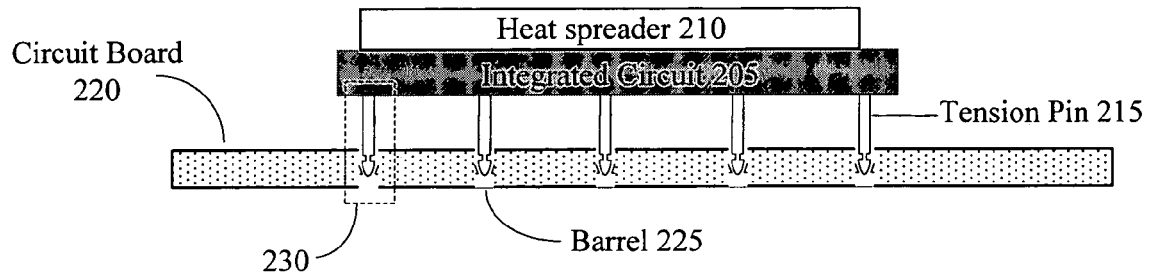
FIG. 2 illustrates a cross-sectional elevation view of an integrated circuit with tension pins and a circuit board having corresponding barrels.

FIG. 2 illustrates a perspective view of tension pins coupled to integrated circuit 205 to engage a plurality of corresponding barrels (also referred to as press-fit barrels), such as barrel 225, in circuit board 220. Integrated circuit 205 may be any integrated circuit for coupling to a circuit board, such as a microprocessor, a controller hub, programmable array logic (PAL) device, a clocking circuit, a microcontroller, an embedded processor, a memory device, a network controller, a graphics controller, or an audio controller.

Moreover, in one embodiment integrated circuit 205 further comprises a package. As a specific example, integrated circuit 205 includes a microprocessor in a flip-chip pin grid array (FCPGA) package. Alternatively, integrated circuit 205 is a controller hub, such as a northbridge, southbridge, or other chipset related circuit in a wirebond package. However integrated circuit 205 is not so limited, in that, integrated circuit 205 may include any style of package or no package at all.

Circuit board 220 may be a printed circuit board. Examples of printed circuit boards include: graphics cards, motherboards, device interface cards (network cards, modems, universal serial bus cards, TV tuner cards, etc.), and other embedded circuit boards. As a specific embodiment, circuit board 220 is a multi-layered motherboard for coupling a plurality of integrated circuits to. Another example of circuit board 220 is a printed circuit board for coupling an embedded controller to.

FIG. 2 also illustrates, heat spreader 210; even though, heat spreader 210 is not required. In one embodiment, heat spreader 210 is an integrated heat sink (IHS). An IHS typically comprises an integrated heat spreader, a barrier layer, intermetallic solder layers coupled to a backside metallization layer and an integrated circuit die. Heat spreader 210 may also be a simple heat spreading device or a commonly known heat sink coupled to integrated circuit 205. In one embodiment, which is not specifically depicted, heat spreader 210 is viewed as part of integrated circuit 205, wherein tension pins 215 are coupled to any part of integrated circuit 205.

Figure 3:
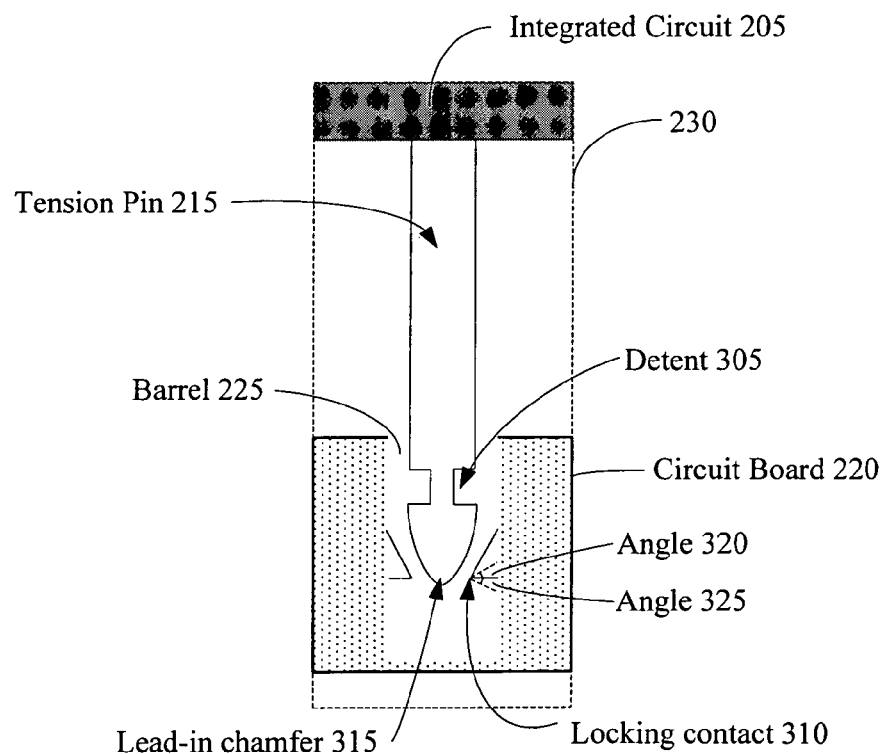
FIG. 3 illustrates an enlarged portion of FIG. 2.

Referring to FIG. 3, enlarged portion 230 of FIG. 2 is shown. Tension pin 215 is coupled to integrated circuit 205. Tension pin 215 may be coupled to integrated circuit 205 in any manner. In one embodiment, integrated circuit 205 is a microprocessor and tension pin 215 is coupled to a substrate or the surface of a substrate of the microprocessor. Tension pin 215 comprises detent 305 to engage corresponding locking contact 310 in corresponding barrel 225. In one embodiment, detent 305 extends around the circumference of tension pin 215. Alternatively, detent 305 is only a portion of the circumference of tension pin 215. Tension pin may comprise any metal, such as copper, iron, aluminum, brass, nickel, gold, or any other metal.

Circuit board 220 comprises a plurality of press-fit barrels, such as barrel 225, which corresponds to tension pin 215. In one embodiment, tension pin 215 comprises two detents, as shown in FIG. 3. However, tension pin 215 is not so limited. Tension pin 215 may comprise one, two, three, or any number of detents for engaging any number of locking contacts in corresponding barrel 225. As stated above, detents in tension pin 215 may extend around any portion of the circumference of tension pin 215.

In one embodiment, tension pin 215 also makes an electrical connection with corresponding barrel 225. For instance, barrel 225 is coupled to a ground plane in circuit board 220. When tension pin 215 engages barrel 225 an electrical connection is made, allowing tension pin 215 to act as a tension pin to couple integrated circuit 205 to circuit board 220 and to provide a ground connection from circuit board 220 to integrated circuit 205.

Furthermore, detent 305 and corresponding locking contact 310 may be designed at any angle to enable: (1) detent 305 and corresponding locking contact 310 to engage and hold integrated circuit 205 in place and (2) detent 305 and corresponding locking contact 310 to disengage, when needed. For instance, if locking contact 310 is designed to a 45 degree angle above a horizontal plane, such as angle 320, and detent 305 is designed at a complementary angle to engage locking contact 310 at that angle, then it may be extremely difficult to disengage tension pin 215 from locking contact 310. Inversely, if locking contact 310 and detent 305 are designed to an angle of 45 degrees below horizontal, such as angle 325, it is potentially difficult to engage locking contact 310 and detent 305 to hold integrated circuit 205 in place. Therefore, the angle of locking contact 310 and of detent 305 may be changed to provide optimal engaging and disengaging properties.

FIG. 3 also illustrates tension pin 215 comprising lead-in chamfer 315. Lead-in chamfer 315 is not required for tension pin 215; however, lead-in chamfer 315 potentially allows for easier insertion of tension pin 215 into locking contact 310. For example, if lead-in chamfer 315 is designed to taper inwards from the diameter/cross-width of tension pin 215, an easier insertion of tension pin 215 into barrel 225 is made possible. The easier insertion is made possible by allowing a skinner portion of tension pin 215 to enter barrel 225 first and then self-align the remaining portion of tension pin 215 in barrel 225.

Figure 4:
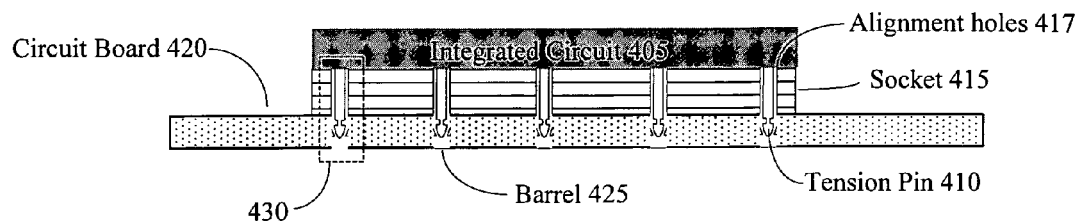
FIG. 4 illustrates a cross-sectional elevation view of an integrated circuit having tension pins, a compression socket, and a circuit board with a plurality of barrels.

Turning to FIG. 4, an illustration similar to FIG. 3 is shown, with compression socket 415. Integrated circuit 405 comprises tension pins 410. Additionally, as stated above, integrated circuit 405 may include any circuit devices, packaging, or heat dissipating devices. Circuit board 420 comprises barrels 425 and is any circuit board or printed circuit board for coupling an integrated circuit to. Socket 415 is any socket for coupling integrated circuit 405 to circuit board 420. In one embodiment, socket 415 is a compression socket. As another example, integrated circuit 405 comprises a microprocessor in a package, socket 415 is a compression socket, and circuit board 420 is a motherboard.

A compression socket may be any socket including contacts that are compressed to make an electrical connection between two pads. Examples of compression sockets include land-grid array (LGA) sockets, a metalized-particle interconnect (MPI) socket, and a pogo pin socket. A LGA socket comprises an array of compressible clips/contacts, an MPI socket include a plurality of compressible metalized-particle columns, and a pogo pin socket comprises a plurality of compressible pogo pins. MPI sockets for microprocessors are discussed in more detail in pending application P19835.

Socket 415 further comprises alignment/through holes 417 for tension pins 410 to pass through. In one embodiment, alignment holes 417 are aligned with tension pins 410 and barrels 425 for tension pins to pass through and align with barrels 425 in circuit board 420. In another embodiment, socket 415 further comprises alignment pins, not depicted, to align socket 415's alignment holes with barrels 425 on circuit board 420. These alignment pins in socket 415 may fit in holes in circuit board 420 for the purpose of aligning the socket to circuit board 420.

Figure 5:
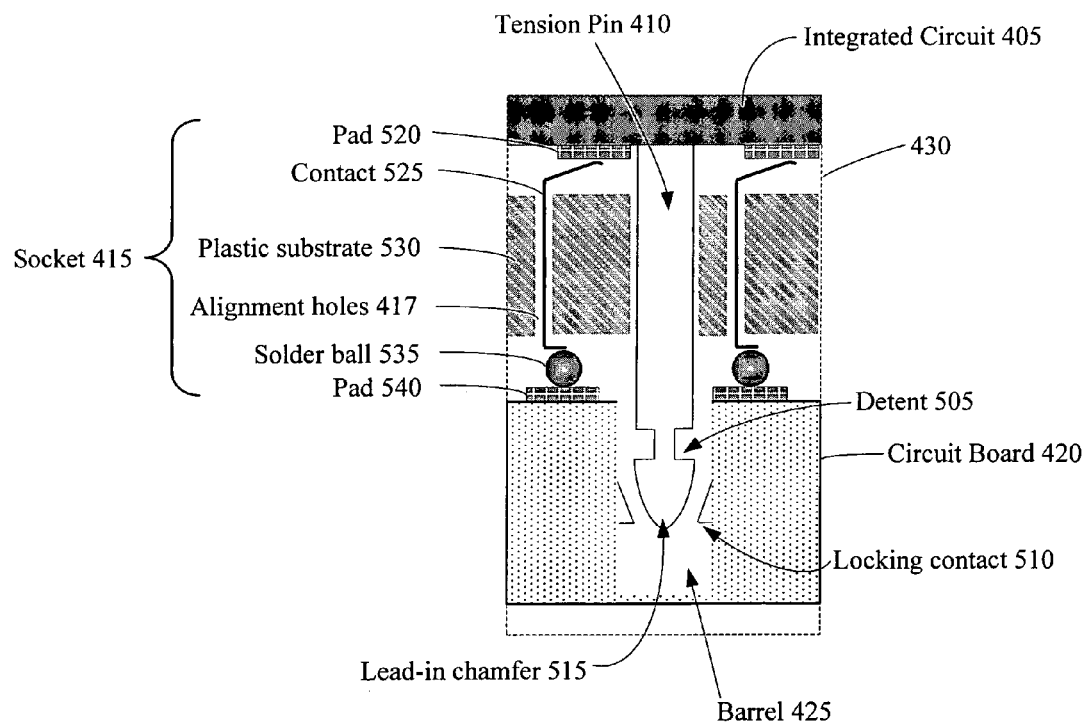
FIG. 5 illustrates an enlarged portion of FIG. 4 with an embodiment of a land-grid array compression socket.

Referring next to FIG. 5, an enlarged portion of FIG. 4 is shown with a specific embodiment of a land-grid array compression socket. FIG. 5 still includes integrated circuit 405 comprising lead-in chamfer 515 and tension pin 410 to engage corresponding barrel 425, tension pin 410 comprising detent 505 to engage corresponding locking contact 510 in barrel 425. In addition, socket 415 is illustrated as a land-grid array compression socket. Pad 520 is electrically coupled to integrated circuit 405, while pad 540 is electrically coupled to circuit board 420. Plastic substrate 530, which is also referred to as an interposer, houses contacts 525 in alignment holes 417. Contact 525 is a compressible contact/clip. Contact 525 is soldered to pad 540 with solder ball 530.

When downwards force is applied to integrated circuit 405 to engage tension pin 410 with barrel 425, detent 505 and locking contact 510 engage to hold integrated circuit 405 in place and compress compression socket 415. As an example, approximately 120 lbs of downwards force is applied to compress compression socket 415 and engage tension pin 410 with barrel 425. When compression contact 525 is compressed to make electrical connection between pad 520 and contact 525, then electrical connection between integrated circuit 405 and circuit board 420 through pad 520, contact 525, solder ball 535 and pad 540 is created/made. Inversely, it is readily apparent, that contact 525 may be initially electrically connected to pad 520 and compression of compression socket 415 creates/makes electrical connection between pad 540 and contact 525.

In this example, integrated circuit 405 essentially creates a reactive force on compression socket 415 to compress contact 525. When detent 505 in tension pin 410 engages locking contact 510 in barrel 425, compression socket 415 is compressed creating a upwards spring force from contact 525 and other compression contacts in socket 415. However, since tension pin 415 is coupled to integrated circuit 405, integrated circuit 405 is held in place causing/creating a reactive downwards force in response to compression socket 415's upwards spring force. Any single compression pin may be designed to clip/engage with a corresponding locking contact to result in any amount of reactive force from integrated circuit 405. As an illustrative range, each compressible contact, such as compression contact 525 causes/creates between 20 to 40 grams of upwards spring force; therefore, each tension pin may cause/exert 20 to 40 grams per compression contact of reactive force.

Figure 6:
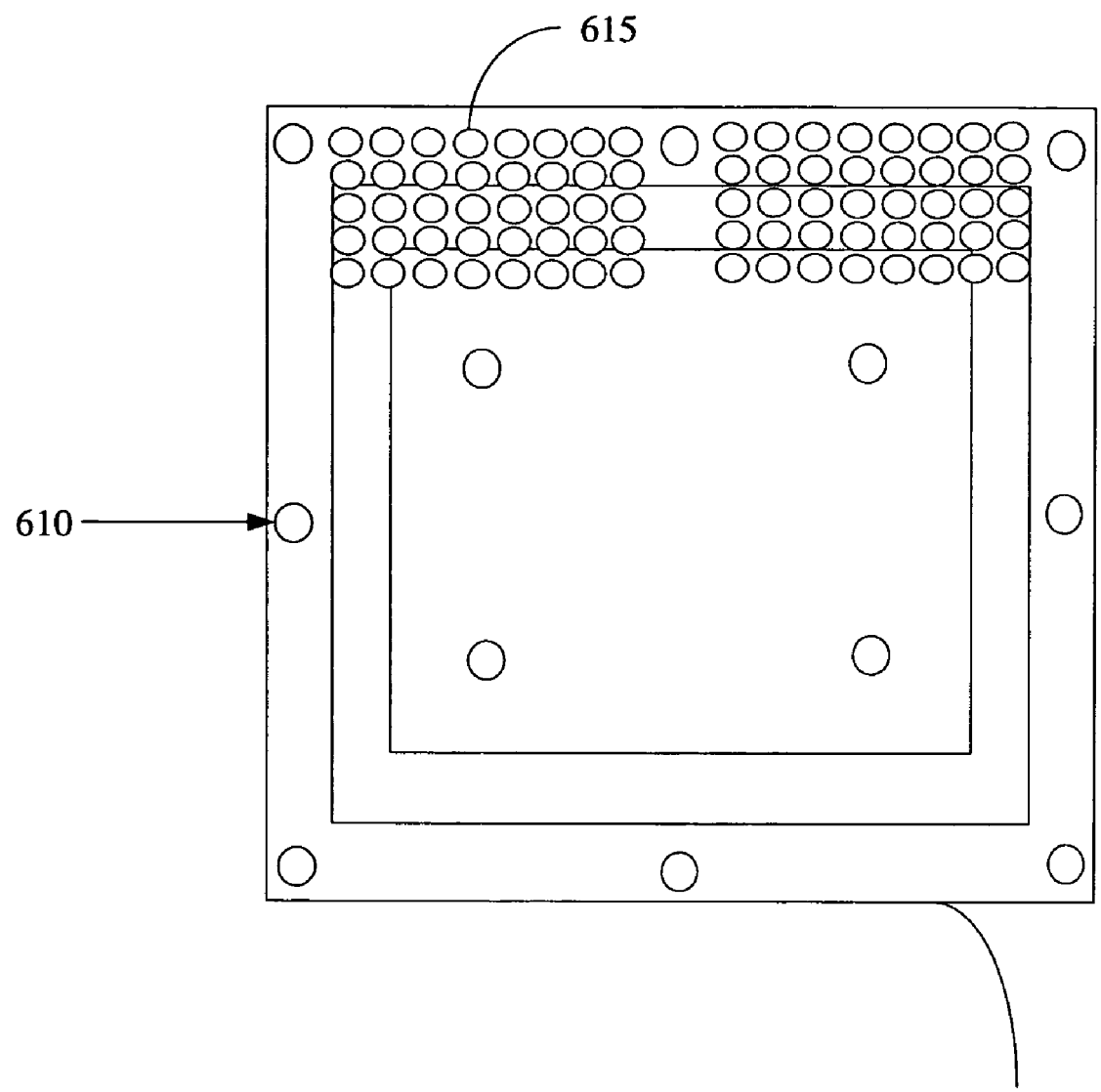
FIG. 6 illustrates a top view of an integrated circuit having a packaged microprocessor with a plurality of pads.

Turning to FIG. 6, a top view of an integrated circuit is illustrated. Integrated circuit 605 may include a microprocessor die, packaging, bumps, pads, tension pins, a heat sink, and any other materials, connectors, or logic. Integrated circuit 605 illustrates twelve tension pins, including tension pin 610. Each tension pin, when engaged with its corresponding barrel in a motherboard, creating/exerting approximately 20 to 40 grams of reactive force per compression contact from integrated circuit 605 on a compression socket. For example, if there are 775 compressible contacts, each creating 40 grams of upwards spring force, and twelve tension pins are used, then each tension pin would create approximately 2583 grams of reactive force.

Integrated circuit 615 also includes a first set of pads 615. When the tension pins, such as tension pin 610, are inserted into their corresponding barrels in a motherboard, a compression socket is compressed to make an electrical connection between the first set of pads and a second set of pads on the motherboard.

Figure 7:
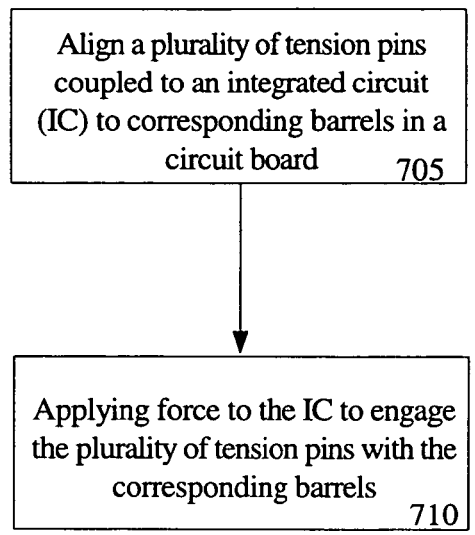
FIG. 7 illustrates an embodiment of a method for engaging tension pins coupled to an integrated circuit with a circuit board.

Next, FIG. 7 illustrates a method for coupling an integrated circuit to a circuit board using tension pins. First, as shown in block 705, a plurality of tension pins coupled to an integrated circuit are aligned with a plurality of corresponding barrels in a circuit board. In block 710, force is then applied to the integrated circuit to engage the plurality of tension pins with the corresponding barrels. As an example, approximately, 120 to 140 lbs of force is applied to the integrated circuit to engage the plurality of tension pins with the corresponding barrels. Any known method may be used for applying force to the integrated circuit. For instance, a mechanical lever is used to apply the force to the integrated circuit. The tension pins, integrated circuit, circuit board, and barrels may include any of the elements, circuits, and packaging previously discussed.

Figure 8:
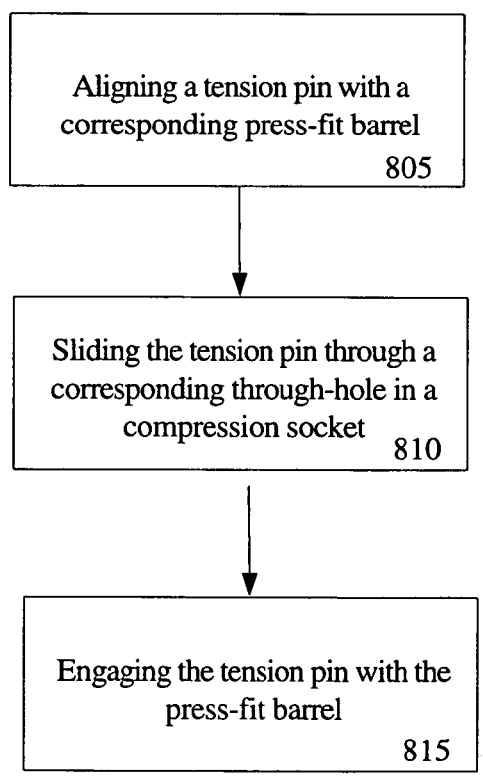
FIG. 8 illustrates an embodiment of a method for engaging tension pins coupled to an integrated circuit with a circuit board to compress a compression socket.

Referring to FIG. 8, a method for coupling an integrated circuit to a circuit board with a socket is illustrated. First in step 805, a tension pin coupled to an integrated circuit is aligned with a corresponding press-fit barrel. Second the tension pin is slid through a through hole in a compression socket. Finally, the tension pin is engaged with the press-fit barrel. Much like the method in FIG. 7, engaging the tension pin or pins with the press-fit barrel or plurality of press-fit barrels may comprise applying force to the integrated circuit until the tension pins engage the press-fit barrels.

Coupling an integrated circuit to a circuit board utilizing tension pins and press-fit barrels eliminates the need to include a backing-plate on the backside of the circuit board. The tension pins disperse the force required by a top clamping plate throughout the area of the integrated circuit, instead of requiring a backing-plate. Therefore, by eliminating the requirement for a backing-plate, essential active and passive device may be placed on the backside of the circuit board. Furthermore, the tension pin press-fit barrel combination is potentially able to exert enough force to compress a compression socket to make an electrical connection between an integrated circuit and a circuit board. Therefore, the swapability and upgradeability of the integrated circuit and the socket is gained by using tension pins to compress a compression socket. When an integrated circuit or a socket is replaced or updated, the tension pins merely disengaged to allow replacement of either the integrated circuit or the socket.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus comprising:
an integrated circuit; and
a plurality of tension pins coupled to the integrated circuit to engage a plurality of corresponding barrels in a circuit board, the tension pins holding the integrated circuit in place, wherein each tension pin comprises a lead-in chamfer and at least one detent to engage a locking contact in each of the barrels.

2. The apparatus of claim 1, wherein the integrated circuit comprises a device selected from a group consisting of a microprocessor, a controller hub, a programmable array logic (PAL) device, a microcontroller, and embedded processor, a memory device, a network controller, and a graphics controller.

3. The apparatus of claim 2, wherein the circuit board is a motherboard and the plurality of tension pins are also to make electrical connection with the plurality of corresponding barrels in the motherboard.

4. The apparatus of claim 3, wherein the tension pins are also (1) to pass through corresponding alignment holes in a compression socket and (2) to create a reactive force from the integrated circuit for compressing the compression socket, when the plurality of tension pins engage the plurality of corresponding barrels.

5. The apparatus of claim 4, wherein the compression socket comprises a plurality of compression contacts, and wherein there is a tension pin for every 50 to 75 compression contacts.

6. The apparatus of claim 4, wherein the microprocessor has a first set of pads and the motherboard has a second set of pads, and wherein compressing the compression socket makes an electrical connection between the first and second set of pads.

7. The apparatus of claim 6, wherein the type of compression socket is selected from a group consisting of a land grid array (LGA) socket, a metalized-particle interconnect (MPI) socket, and a pogo pin socket.

8. The apparatus of claim 7, wherein the compression socket further comprises alignment pins to align the socket with the motherboard.

9. An apparatus comprising:
a microprocessor; and a tension pin comprising a detent coupled to the microprocessor to (1) pass through a compression socket, (2) engage a press-fit barrel in a motherboard, (3) compress the compression socket.

10. The apparatus of claim 9, wherein the tension pin is surface mounted to a substrate of the microprocessor.

11. The apparatus of claim 9, wherein the press-fit barrel has a locking contact.

12. The apparatus of claim 9, wherein the tension pin is operable to disengage the press-fit barrel.

13. The apparatus of claim 9, wherein the type of compression socket is selected from a group consisting of a land grid array (LGA) socket, a metalized-particle interconnect (MPI) socket, and a pogo pin socket.

14. The apparatus of claim 11, wherein the tension pin further comprises a lead in chamfer, and wherein the detent is to engage the locking contact.

15. A system comprising:
an integrated circuit comprising a first set of pads and a plurality of tension pins, each tension pin comprising a detent;
a socket comprising compression contacts and a plurality of through-holes for the plurality of tension pins to pass through; and
a motherboard comprising a second set of pads and a plurality of press-fit barrels, each press-fit barrel corresponding to one of the plurality of tension pins, wherein each press-fit barrel comprises a locking contact engaged with the corresponding detent to compress the compression contacts for making an electrical connection between the first and second set of pads.

16. The system of claim 15, wherein the integrated circuit is a microprocessor.

17. The system of claim 15, wherein the integrated circuit is selected from a group consisting of a controller hub, and a programmable array logic (PAL) device.

18. The system of claim 15, wherein the type of compression contacts are selected from a group consisting of a land grid array clip, a metalized-particle interconnect (MPI) column, and a pogo pin.

19. The system of claim 15, wherein each tension pin makes an electrical connection with the corresponding press-fit barrel.

20. The system of claim 16, wherein the plurality of tension pins are coupled to the surface of a substrate of the microprocessor, and wherein each tension pin further comprises a lead-in chamfer.

21. A method comprising:
aligning a plurality of tension pins coupled to an integrated circuit with a plurality of corresponding barrels in a circuit board, wherein each tension pin includes a detent; and
applying force to the integrated circuit to engage the tension pins with their corresponding barrels.

22. The method of claim 21, wherein each corresponding barrel comprises a locking contact to engage with the detent, when force is applied.

23. The method of claim 21, wherein the integrated circuit is selected from a group consisting of a microprocessor, a controller hub, a programmable array logic (PAL) device, and a graphics processor.

24. The method of claim 21, further comprising disengaging the tension pins from their corresponding barrels.

25. The method of claim 22, wherein 120 lbs to 140 lbs of force is applied to the integrated circuit to engage the plurality of detents in the plurality of tension pins with the plurality of corresponding locking contacts in the plurality of corresponding barrels.

26. The method of claim 25, wherein a mechanical lever is used to apply the 120 to 140 lbs of force to the integrated circuit.

27. A method comprising:
aligning a tension pin coupled to a microprocessor with a corresponding press-fit barrel in a motherboard, the microprocessor comprising a first pad, the motherboard comprising a second pad, the tension pin comprising a detent, and the press-fit barrel comprising a locking contact;
sliding the tension pin through a corresponding through-hole in a compression socket, the compression socket comprising a compression contact that, when compressed, makes an electrical connection between the first pad and the second pad;
engaging the detent with the locking contact to compress the compression contact.

28. The method of claim 27, further comprising disengaging the detent from the locking contact.

29. The method of claim 27, wherein the tension pin further comprises a lead-in chamfer, and wherein the tension pin is coupled to a substrate of the microprocessor.

30. The method of claim 27, wherein the type of compression contacts are selected from a group consisting of a land grid array clip, a metalized-particle interconnect (MPI) column, and a pogo pin.

31. The method of claim 27, wherein engaging the detent with the locking contact comprises applying force to the microprocessor until the detent is engaged with the locking contact.

32. The method of claim 27, wherein the force applied to the microprocessor is in the range of 110 to 160 pounds.

* * * * *